US008981831B1

(12) United States Patent
Kossel et al.

(10) Patent No.: US 8,981,831 B1
(45) Date of Patent: Mar. 17, 2015

(54) LEVEL SHIFTER WITH BUILT-IN LOGIC FUNCTION FOR REDUCED DELAY

(71) Applicant: International Business Machines Corporation, Armonk, NY (US)

(72) Inventors: Marcel A. Kossel, Reichenburg (CH); Daihyun Lim, West New York, NJ (US); Pradeep Thiagarajan, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/024,233

(22) Filed: Sep. 11, 2013

(51) Int. Cl.
*H03L 5/00* (2006.01)
*H03K 19/0185* (2006.01)

(52) U.S. Cl.
CPC .............................. *H03K 19/018507* (2013.01)
USPC ................................ 327/333; 326/68; 326/81

(58) Field of Classification Search
CPC .............. H03K 19/017509; H03K 19/018507; H03K 19/018514; H03K 19/018521; H03K 19/018528; H03K 19/20
USPC ............................ 327/333; 326/63, 68, 80, 81
See application file for complete search history.

(56) References Cited

U.S. PATENT DOCUMENTS

| | | | |
|---|---|---|---|
| 4,663,701 A | 5/1987 | Stotts | |
| 4,942,316 A | 7/1990 | Beranger et al. | |
| 5,684,415 A | 11/1997 | McManus | |
| 5,798,972 A | 8/1998 | Lao et al. | |
| 6,288,591 B1 | 9/2001 | Riccio | |
| 6,384,628 B1 | 5/2002 | Lacey et al. | |
| 6,404,229 B1 | 6/2002 | Barnes | |
| 6,580,411 B1 | 6/2003 | Kubota et al. | |
| 6,614,283 B1 | 9/2003 | Wright et al. | |
| 6,677,798 B2 | 1/2004 | Chang et al. | |
| 6,690,605 B2 * | 2/2004 | Schafer et al. | 365/189.11 |
| 6,803,801 B2 | 10/2004 | Randazzo et al. | |
| 6,864,718 B2 | 3/2005 | Yu | |
| 6,998,668 B2 | 2/2006 | Nakase et al. | |
| 7,009,424 B2 | 3/2006 | Khan et al. | |
| 7,068,074 B2 | 6/2006 | Bhattacharya et al. | |
| 7,145,364 B2 | 12/2006 | Bhattacharya et al. | |
| 7,180,329 B1 * | 2/2007 | Sia et al. | 326/81 |

(Continued)

OTHER PUBLICATIONS

Kuo, K. et al., "Low Power Level Shifter and Combined with Logic Gates", IEEE, 2010, pp. 324-327.

(Continued)

*Primary Examiner* — William Hernandez
(74) *Attorney, Agent, or Firm* — David Cain; Roberts Mlotkowski Safran & Cole, P.C.

(57) ABSTRACT

A method and circuit for implementing a level shifter with built-in-logic function for reduced delay. The circuit including at least one set of inputs from a first power supply domain. The circuit further including at least two cross coupled field effect transistors (FETs) connected to a second power supply domain. The circuit further including a true logic gate connected to the first power supply domain and the at least two cross coupled FETs. The true logic gate being configured to generate a logic function based on the at least one set of inputs. The circuit further including a complementary logic gate connected to the first power supply domain and the at least two cross coupled FETs. The complementary logic gate being configured to generate a complement of the logic function based on the at least one set of inputs.

17 Claims, 6 Drawing Sheets

(56) References Cited

U.S. PATENT DOCUMENTS

| | | |
|---|---|---|
| 7,180,353 B2 | 2/2007 | Chiu et al. |
| 7,180,355 B2 | 2/2007 | Teraishi |
| 7,199,617 B1 | 4/2007 | Schrom et al. |
| 7,215,146 B2 * | 5/2007 | Khan .............................. 326/83 |
| 7,298,196 B2 | 11/2007 | Teraishi |
| 7,417,468 B2 * | 8/2008 | Verbauwhede et al. ...... 326/112 |
| 7,446,564 B2 | 11/2008 | Huang |
| 7,514,960 B2 | 4/2009 | Shimaya |
| 7,564,263 B2 | 7/2009 | Walker et al. |
| 7,567,112 B2 * | 7/2009 | Shen ............................. 327/333 |
| 7,573,313 B2 | 8/2009 | Johansson et al. |
| 7,609,090 B2 | 10/2009 | Srivastava et al. |
| 7,667,522 B1 | 2/2010 | Maung |
| 7,696,805 B2 | 4/2010 | Thorp et al. |
| 7,710,152 B1 * | 5/2010 | El Bacha et al. ................ 326/81 |
| 7,768,308 B2 * | 8/2010 | Maede et al. ................... 326/68 |
| 7,777,548 B2 | 8/2010 | Kang |
| 7,800,426 B2 | 9/2010 | Chang |
| 7,816,969 B2 | 10/2010 | Yoo |
| 7,834,662 B2 | 11/2010 | Campbell et al. |
| 7,852,118 B2 * | 12/2010 | Deutscher et al. .............. 326/68 |
| 7,881,756 B2 | 2/2011 | Park et al. |
| 7,884,643 B2 * | 2/2011 | Wang et al. ...................... 326/68 |
| 7,965,123 B2 | 6/2011 | Su |
| 7,994,820 B2 | 8/2011 | Campbell et al. |
| 8,085,065 B2 | 12/2011 | Zhang |
| 8,283,964 B2 | 10/2012 | Cassia |
| 8,669,803 B2 * | 3/2014 | Huang et al. ................... 327/333 |
| 2008/0054979 A1 * | 3/2008 | Nagumo ....................... 327/309 |

OTHER PUBLICATIONS

Menolfi, C. et al., "A 14Gb/s High-Swing Thin-Oxide Device SST TX in 45nm CMOS SOI", IEEE, International Solid-State Circuits Conference, 2011, 3 pages.

Uyemura, J., "CMOS Logic Circuit Design", 1999, 14 pages.

* cited by examiner

LEVEL SHIFTER WITH BUILT-IN LOGIC FUNCTION FOR REDUCED DELAY

FIELD OF THE INVENTION

The invention relates generally to the data processing field, and more particularly, relates to a method and circuit for implementing a level shifter with built-in-logic function for reduced delay.

BACKGROUND

In a multi-voltage system, integration of more than one type of integrated circuit (IC) in a functional system is common. Consequently, there is a necessity for a level shifter circuit that is configured to shift the voltage level at the output of one IC to the voltage level at the input of another IC. For example, the output of an IC that operates at a higher voltage level may be provided to another IC that operates at a lower voltage level. In this instance, the voltage needs to be ramped down to a lower level. Similarly, when the output of an IC that operates at a lower voltage level is input to an IC that has a higher operating voltage, the voltage needs to be ramped up.

A limitation of a conventional level shifter with embedded logic is that the level shifter and corresponding logic are typically designed between the multi-voltage ICs in a cascading relationship such that there is unnecessary delay added to the ICs. For example, conventionally a first supply voltage domain is input into a level shifter from a first IC, the level shifter outputs a second supply voltage domain different from the first supply voltage domain, the second supply voltage domain may be input into the logic (e.g., true logic) as a signal, and subsequently the logic acquires a function based on the input second supply voltage domain, which is input into a second IC. Thus, there is unnecessary delay added to the IC because initially the level shifter is configured to ramp up or down the first supply voltage domain to the second supply voltage domain (e.g., introducing a first delay), and subsequently, the logic is configured to acquire a function using the second supply voltage domain provided by the level shifter (e.g., introducing a second delay).

In view of the foregoing, there is a need for a level shifter circuit that supports a voltage level shifting function as well as a built-in-logic function without leading to extra delay in the ICs in comparison to a cascaded system. Accordingly, there exists a need in the art to overcome the deficiencies and limitations described hereinabove.

SUMMARY

In a first aspect of the invention, a circuit is provided for including at least one set of inputs from a first power supply domain. The circuit further including at least two cross coupled field effect transistors (FETs) connected to a second power supply domain. The circuit further including a true logic gate connected to the first power supply domain and the at least two cross coupled FETs. The true logic gate being configured to generate a logic function based on the at least one set of inputs. The circuit further including a complementary logic gate connected to the first power supply domain and the at least two cross coupled FETs. The complementary logic gate being configured to generate a complement of the logic function based on the at least one set of inputs.

In another aspect of the invention, a structure is provided for including at least one set of inputs from a first power supply domain. The structure further including at least two cross coupled field effect transistors (FETs) connected to a second power supply domain. The structure further including a true logic gate connected to the first power supply domain and the at least two cross coupled FETs. The true logic gate being configured to generate a logic function based on the at least one set of inputs. The structure further including a complementary logic gate connected to the first power supply domain and the at least two cross coupled FETs. The complementary logic gate being configured to generate a complement of the logic function based on the at least one set of inputs. The structure further including a protection interface positioned between the at least two cross coupled FETs and the true and complementary logic gates. The protection interface being controlled by high and low protection analog voltages.

In yet another aspect of the invention, a structure is provided for including at least two level shifters configured to receive a set of input vectors in a first voltage domain to create a true and complement output function in a second voltage domain. Each of the at least two level shifters being powered by the second voltage domain. Each of the at least two level shifters being configured to generate a true and complement sub-function output in the second voltage domain. Each of the at least two level shifters comprising a stacking of a number of transistors less than a predetermined number. The at least two level shifters being configured to operate in parallel such that each true and complement sub-function output is coupled with one or more AND or OR gates to create the true and complement output function respectively for all combinations of the set of input vectors.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates generally to the data processing field, and more particularly, relates to a method and circuit for implementing a level shifter with built-in-logic function for reduced delay. In embodiments, a circuit is provided that is configured to provide a level shift function for converting signals in a first voltage domain into signals in a second voltage domain. The level shifter further incorporates Boolean logic functions to both translate and logically process signals, thereby saving downstream levels of logic.

Figure 1:
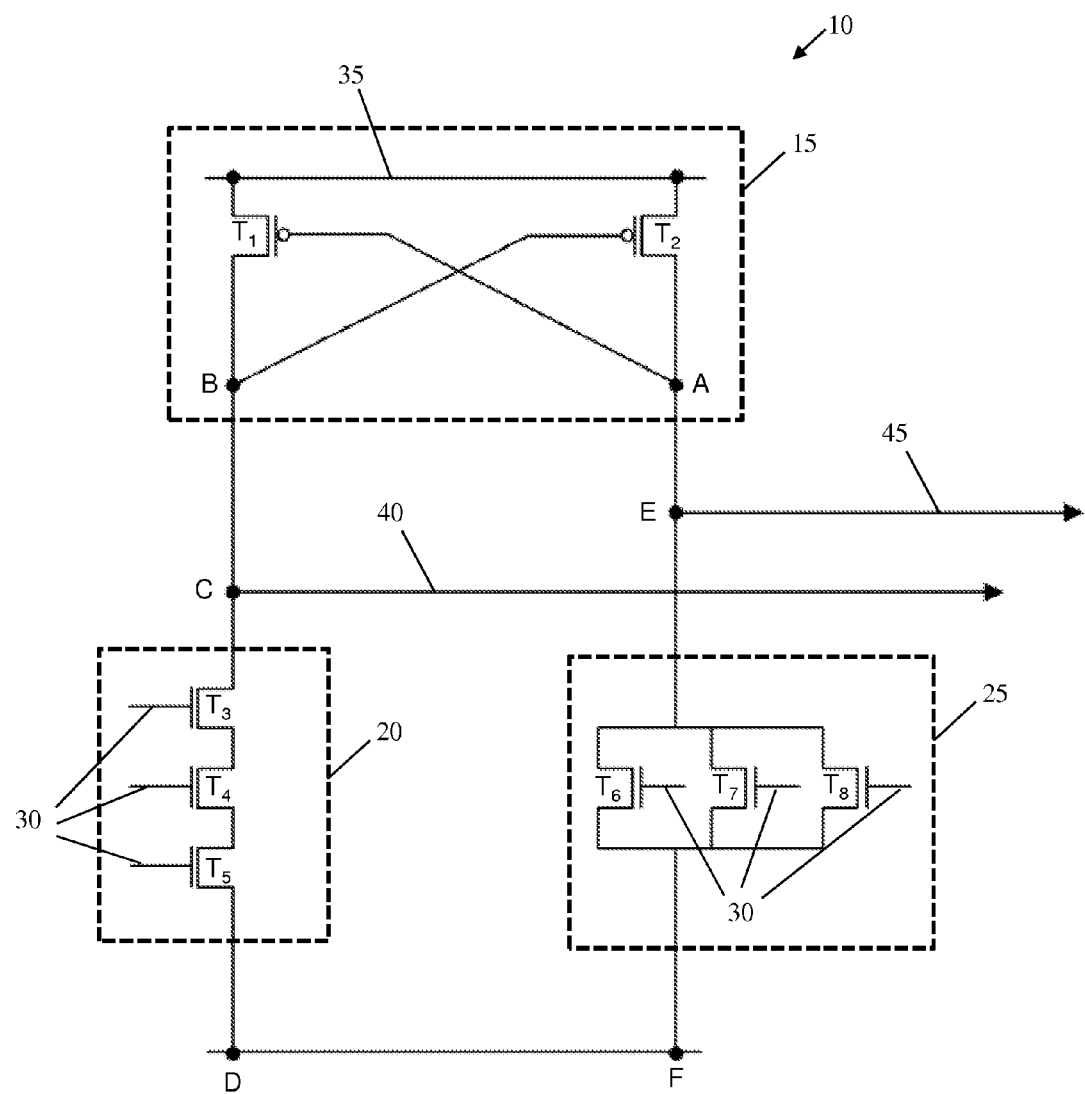
FIGS. 1 and 2 are schematic diagrams of level shifter circuits with embedded logic in accordance with aspects of the invention.

FIG. 1 shows a circuit diagram of a level shifter 10 in accordance with aspects of the present invention. In embodiments, the level shifter 10 includes a cross coupled field effect transistor (FET) 15, an embedded logic component comprising a true logic component 20 and a complementary logic component 25, a first supply voltage domain 30, a second supply voltage domain 35, an output function 40 (e.g., "Fbar"), and a complementary output function 45 (e.g., "F").

As should be understood by those of ordinary skill in the art, the true logic component 20 and the complementary logic component 25 may be reversed such that the complementary logic component 25 is on the left arm of the level shifter 10 and the true logic component 20 is on the right arm of the level shifter 10 so long as the output function 40 ("Fbar") is generated from the true logic component 20 and the complementary output function 45 ("F") is generated from the complementary logic component 25.

The cross coupled field effect transistor (FET) 15 may comprise at least two transistors $T_1$-$T_2$ (e.g., pFETs). $T_1$ has a source coupled to the second supply voltage domain 35, a gate cross coupled to a node A, and a drain coupled to a node B. $T_2$ has a source coupled to the second supply voltage domain 35, a gate cross coupled to a node B, and a drain coupled to a node A. Accordingly, the second supply voltage domain 35 powers the level shifter 10 through its connections with the cross coupled FETs. As should be understood by those of ordinary skill in the art, the transistors $T_1$-$T_2$ may be pFETs, bipolar junction transistors (BJTS), or any combination thereof. Moreover, as should also be understood by those of ordinary skill in the art, the term coupled as used herein refers to an electrical coupling where one element is electrically coupled or connected to another element.

The true logic component 20 may comprise transistors $T_3$-$T_5$ (e.g., nFETs). The gates of $T_3$-$T_5$ are coupled to receive "n" vectors or signals (e.g., an input vector definition comprising a set of vectors or signals) in the first supply voltage domain 30 (e.g., the vectors or signals may comprise zero volts (low signal) or a voltage from the first supply voltage domain 30 (high signal)). In embodiments, the "n" vectors or signals may be the output of a logic gate upstream of the true logic component 20. Generally, however, any input vector or signal may be used without departing from the spirit and scope of the present invention. $T_3$ has a drain coupled to a node C and a source coupled to a source of $T_4$. The node C is configured to deliver the output function 40 from the true logic component 20. As should be understood by those of ordinary skill in the art, the drain of $T_1$ is coupled electrically to the drain of $T_3$ through nodes B and C such that the drain of $T_1$ creates the output function 40 in the second supply voltage domain 35. However, in alternative embodiments, the drain of $T_1$ may be coupled electrically to the drain of $T_3$ without the use of nodes B and/or C to create the output function 40 in the second supply voltage domain 35. $T_4$ has a drain coupled to the source of $T_3$ and a source coupled to a drain of $T_5$. $T_5$ has a drain coupled to the source of $T_4$ and a source coupled to ground D. As should be understood by those of ordinary skill in the art, the transistors $T_3$-$T_5$ may be nFETs, bipolar junction transistors (BJTS), or any combination thereof.

The complementary logic component 25 may comprise transistors $T_6$-$T_8$ (e.g., nFETs). The gates of $T_6$-$T_8$ are coupled to receive "m" vectors or signals in the first supply voltage domain 30. In embodiments, the "n"vectors or signals received by the logic component 20 and the "m"vectors or signals received by complementary logic component 25 may be the same or different depending on the required output function 40 and complementary output function 45. $T_6$ has a drain coupled to a node E and a source coupled to ground F. The node E is configured to output the complementary function output 45 from the complementary logic component 25. $T_6$ has a drain coupled to a node E and a source coupled to ground F. $T_7$ has a drain coupled to a node E and a source coupled to ground F. $T_8$ has a drain coupled to a node E and a source coupled to ground F. The node E is configured to deliver the complementary output function 45 from the complementary logic component 25. As should be understood by those of ordinary skill in the art, the drain of $T_2$ is coupled electrically to the drains of $T_6$-$T_8$ through nodes A and E such that the drain of $T_2$ creates the complementary output function 45 in the second supply voltage domain 35. However, in alternative embodiments, the drain of $T_2$ may be coupled electrically to the drains of $T_6$-$T_8$ without the use of nodes A and/or E to create the complementary output function 45 in the second supply voltage domain 35.

As should be understood by those of ordinary skill in the art, the input "n" vector definition for the first supply voltage domain 30 ultimately determines the output function 40 for any given scheme of transistor arrangement within the true logic component 20 and the input "m" vector definition for the first supply voltage domain 30 ultimately determines the output function 45 for any given scheme of transistor arrangement within the complementary logic component 25. For example, if the "n" vectors or signals for transistors $T_3$-$T_5$ are A, B, and C and the "m" vectors or signals for transistors $T_6$-$T_8$ are Abar, Bbar, and Cbar, then the transistors $T_3$-$T_5$ may be arranged as a NAND gate that is configured to use the "n" vectors or signals to generate the output function 40 as a NAND operation of the "n" vectors or signals, and the transistors $T_6$-$T_8$ may be arranged as an AND gate that is configured to use the "m" vectors or signals to generate the complementary output function 45 as an AND operation of the "m" vectors or signals. On the other hand, if the "n" vectors or signals for transistors $T_3$-$T_5$ are Abar, Bbar, and Cbar and the "m" vectors or signals for transistors $T_6$-$T_8$ are A, B, and C, then the transistors $T_3$-$T_5$ may be arranged as an OR gate that is configured to use the "n" vectors or signals to generate the output function 40 as an OR operation of the "n" vectors or signals, and the transistors $T_6$-$T_8$ may be arranged as a NOR gate that is configured to use the "m" vectors or signals to generate the complementary output function 45 as a NOR operation of the "m" vectors or signals However, it should be understood that the input vector definition and the transistor arrangement of the true logic component 20 and the complementary logic component 25 may be arranged to construct any type of one or more logic gates in accordance with aspects of the present invention to create any particular output function. For example, the true logic component 20 and the complementary logic component 25 may be built to simplify output function 40 and complementary output function 45 as a function of "ands" and "ors" using traditional techniques such as Karnaugh-maps, De-Morgan's Laws, or other known ways of function simplification.

Accordingly, as shown in FIG. 1, the vectors or signals that drive the cross coupled FET 15 comprise voltages from the second supply voltage domain 35, whereas the vectors or signals that drive the embedded logic (e.g., the true logic component 20 and the complementary logic component 25) comprise voltages from the first supply voltage domain 30. In embodiments, the second supply voltage domain 35 and the first supply voltage domain 30 supply different voltages to the cross coupled FET 15 and the embedded logic respectively, and the level shifter 10 is configured to shift the voltage of first supply voltage domain 30 to the voltage of the second supply voltage domain 35 reflective at outputs 40 and 45. Advantageously, the structure of the above-described level shifter and the use of at least two voltage domains to drive the cross coupled FET and the embedded logic allows for the present invention to have a shorter delay than that of the conventional cascading level shifter structure.

The level shifter with embedded logic described with respect to FIG. 1 operates well as long as a difference between the two supply domains is relatively small, and $V_{gsmax}$ (voltage between gate and source) and $V_{dsmax}$ (voltage between drain and source) are below a $V_{max}$ (reliability voltage). For example, a level-shifting from $V_{ccd}$ to $V_{dd}$ (smaller delta) may not have issues. However, for a level-shift from $V_{dd}$ to $V_{ddr}$ (larger delta), there is a possibility of a $V_{max}$-violation reliability problem, especially, in embodiments in which thin-oxide FETs are used for constructing the transistors of the level shifter. Consequently, to overcome this potential problem, embodiments of the present invention may include extending the structure of FIG. 1 such that the level shifter 10 also incorporates a protection circuit.

For example, in embodiments of the present invention without a protection circuit (e.g., the level shifter 10 shown in FIG. 1), the drains of the cross coupled FETS may drop to 0V in a turned-off state (in which the complementary logic component FET pulls the output down). Therefore, the voltage drop across the turned-off FETs within the cross coupled device is $V_{ddr}$-0V=$V_{ddr}$, which may be higher than the reliability voltage $V_{max}$ of typical thin-oxide FETs (e.g., say $V_{ddr}$=1.5V, where $V_{max}$~1.1V for a given technology). As a consequence, in additional or alternative embodiments, the protection circuit may be added to protect the turned-off FETs in the cross coupled device from gate-oxide breakdown.

Figure 2:
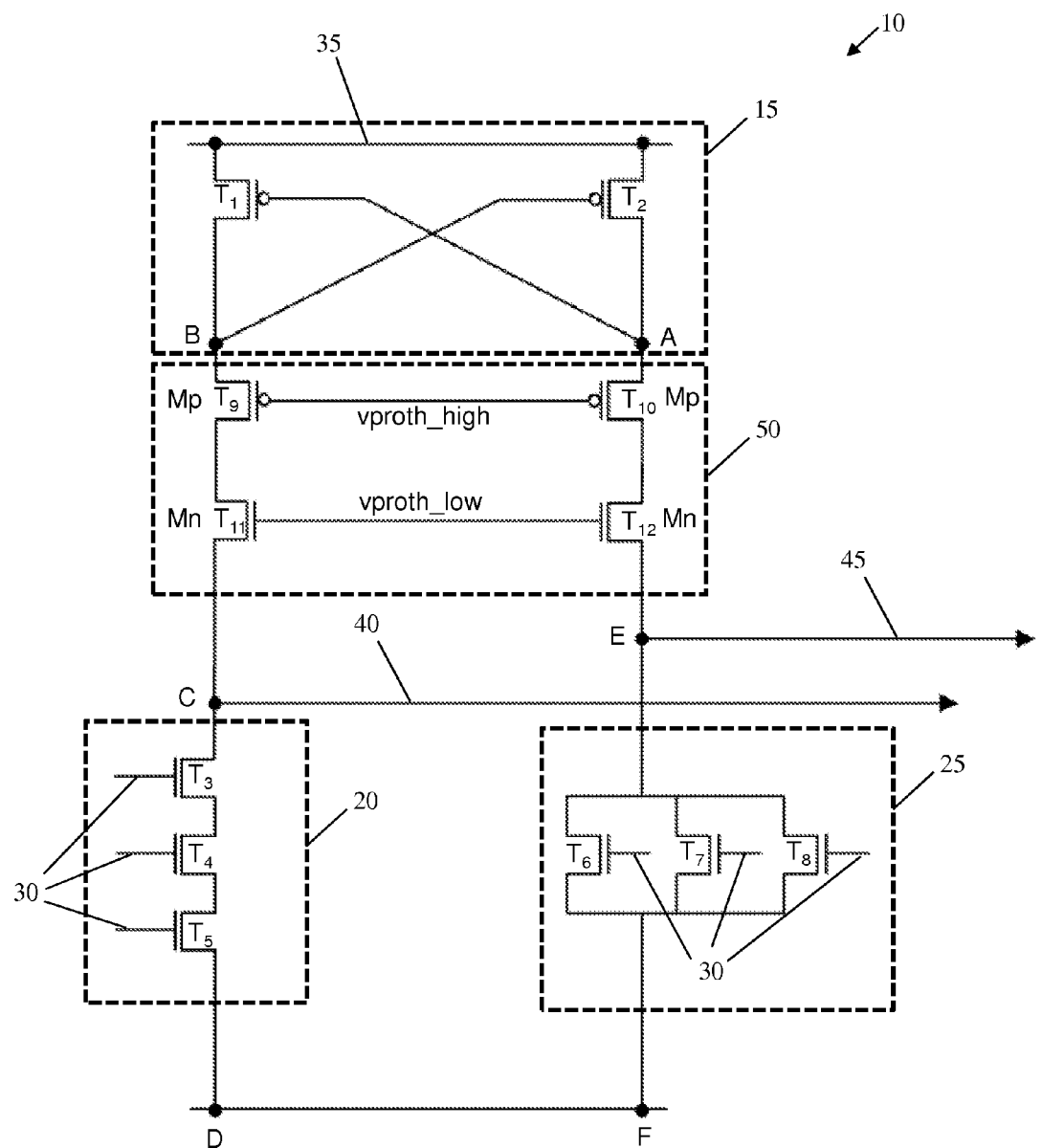

Specifically, as shown in FIG. 2, the level shifter 10 may further comprise a protection circuit 50. The cross coupled FET 15, the embedded logic component comprising the true logic component 20 and the complementary logic component 25, the first supply voltage domain 30, the second supply voltage domain 35, the output function 40, and the complementary output function 45 are similar in structure and function to that described with respect to FIG. 1, and thus are not repeated here for the purpose of simplicity.

In embodiments, the protection circuit may comprise transistors $T_9$-$T_{12}$. $T_9$ has a source coupled to the drain of $T_1$ through node B, a gate coupled to a gate of $T_{10}$, and a drain coupled to a drain of $T_{11}$. $T_{10}$ has a source coupled to the drain of $T_2$ through node A, a gate coupled to a gate of $T_9$, and a drain coupled to a drain of $T_{11}$. $T_{11}$ has a drain coupled to the drain of $T_9$, a gate coupled to a gate of $T_{12}$, and a source coupled to the drain of $T_3$ through node C. $T_{12}$ has a drain coupled to the drain of $T_{10}$, a gate coupled to a gate of $T_{11}$, and a source coupled to the drains of $T_6$-$T_8$ through node E. As should be understood by those of ordinary skill in the art, the transistors $T_9$-$T_{12}$ may be pFETs, nFETs, bipolar junction transistors (BJTS), or any combination thereof. In embodiments, the protection circuit may be a thin-oxide protection circuit.

Accordingly, as shown in FIG. 2, the transistors $T_9$-$T_{10}$ may comprise a first portion Mp (e.g., pFETs) of the protection circuit 50 and the transistors $T_{11}$-$T_{12}$ may comprise a second portion Mn (e.g., nFETs) of the protection circuit 50. In embodiments, the gates of the Mp portion are connected to a first voltage (e.g., vproth_high (=Vddr−Vdd)) and the gates of the Mn portion are connected to a second voltage (vproth_low (=Vdd)). Thus, the FETs of the Mp and Mn portions of the protection circuit 50 are controlled by high and low protection analog voltages, e.g., vproth_high and vproth_low, respectively. In accordance with the aspects of the present invention, the high and low protection analog voltages are selected such that the level shifter 10 circuit may never achieve a $V_{gsmax}$ and/or $V_{dsmax}$ reliability issue.

In accordance with aspects of the present invention, the protection circuit 50 may work as follows. If the gate voltage ("vproth_high") of the transistor $T_9$ or $T_{10}$ Mp is vproth_high=Vddr−Vdd, then the drain of the previously mentioned turned-off FETs (e.g., transistors $T_1$-$T_2$ cannot drop below vproth_high because the source potential of the transistor $T_9$ or $T_{10}$ Mp cannot drop below vproth_high as the channel of the transistor $T_9$ or $T_{10}$ Mp gets fully depleted at a source potential of the transistor $T_9$ or $T_{10}$ Mp of vproth_high if its gate is also at vproth_high ($\rightarrow$$V_{gs}$ of the transistor $T_9$ or $T_{10}$ Mp then becomes 0V). As a consequence, the maximum voltage drop across the turned-off FETs is limited to $V_{ddr}$−vproth_high=$V_{max}$ and the remainder of the voltage drop $V_{ddr}$−$V_{max}$ is then covered by the transistor $T_9$ or $T_{10}$ Mp. As should be understood by those of ordinary skill in the art, the same protection mechanism also works in the other direction for protecting the embedded logic side of the level shifter, and therefore, the protection transistor $T_{11}$ and $T_{12}$ Mn may also be included in the protection circuit. In summary, it can be stated that the protection circuit 50 makes certain that the voltage at node A in the level shifter 10 cannot drop below vproth_high=VDDR−VDD if $T_2$ is turned off (likewise for node B if $T_1$ is in the off state) and it also ensures that node E cannot get higher than vproth_low=VDD if the complementary logic component 25 generates a logical 1 (i.e., it is turned off). Analogously, the voltage of node C is clamped at vproth_low=VDD if the true logic component 30 turns off. Note that both VDD as well as VDDR−vproth_high are smaller than $V_{max}$.

As also should be understood by those of ordinary skill in the art, the protection scheme described above with respect to the protection circuit 50 is one example of a protection scheme that may be used with the level shifter 10, and in alternative embodiments, the protection circuit 50 may be a "black box" configured to take any protection scheme so long as the possibility of a $V_{max}$-violation reliability problem is avoided. Advantageously, using the structure of the above-described level shifter, the use of at least two voltage domains to drive the cross coupled FET and the embedded logic, and the inclusion of the protection circuit, allows for the present invention to have a shorter delay than that of the conventional cascading level shifter structure, with increased $V_{max}$ reliability.

Nonetheless, if a number of FETs stacked on either side of the level shifter increases beyond a limit for a given technology and given supply voltage, an issue may arise within the level shifter embodiments described with respect to FIGS. 1 and 2. For example, for voltage headroom reasons, a stacking of four transistors (e.g., three nFETs+one cross-coupled pFET) may be an upper limit with respect to the level shifter embodiments described in FIGS. 1 and 2 for technologies below 45 nm with a supply voltage smaller than 1.0V. In embodiments, this upper limit may be higher for a higher supply voltage. To address these potential stacking issues, embodiments of the present invention may be configured to split up and parallel process the input vectors or signals (e.g., via two or more of the level shifters 10 with different logical functions) such that the partial results can be processed with a second series of logic downstream to create the final function. Therefore, the function implemented by each of the level shifters in these embodiments is a subset of the overall desired function.

Figure 3:
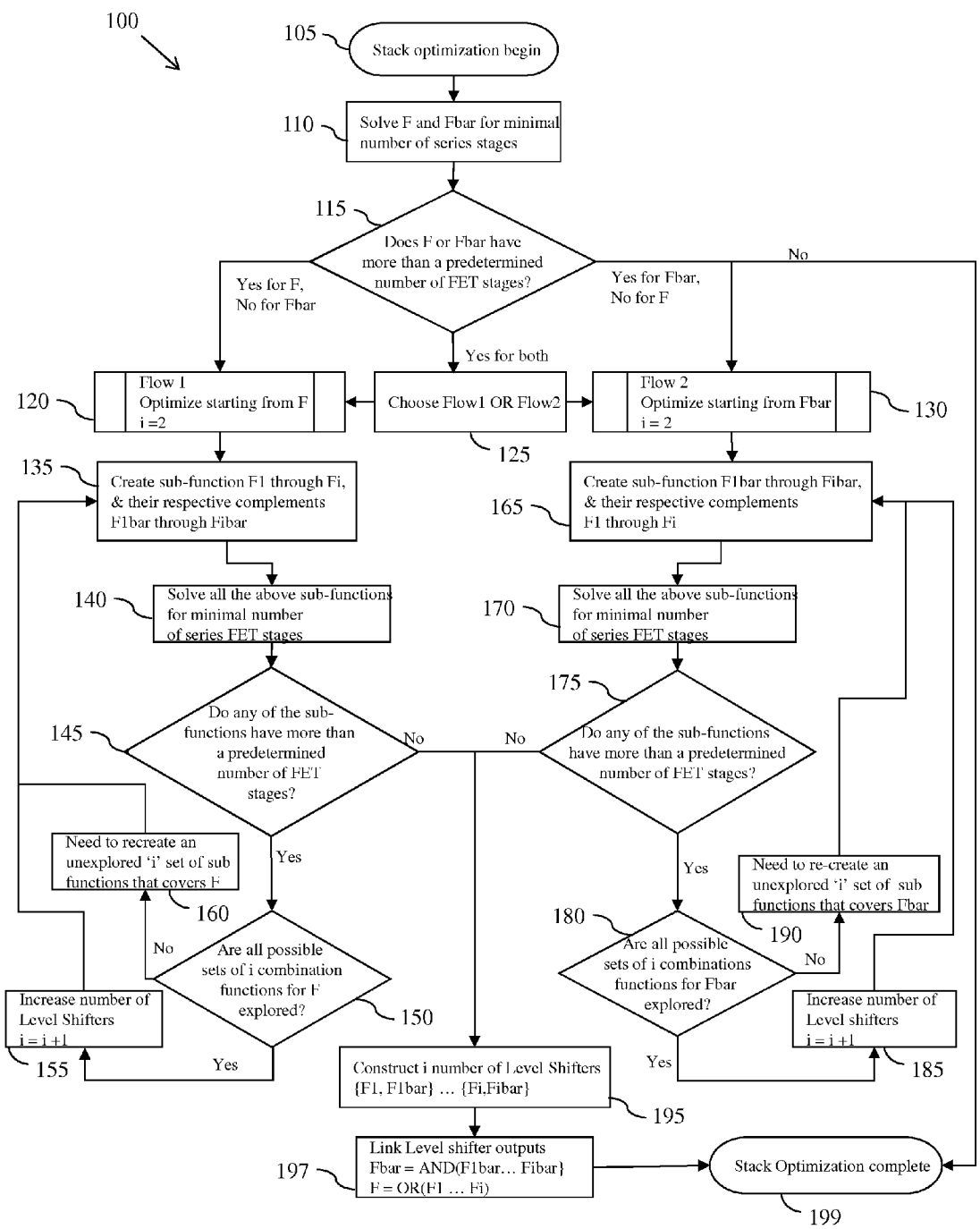
FIG. 3 is an illustrative process flow for implementing the system in accordance with aspects of the invention.

FIG. 3 shows an exemplary flow for performing aspects of the present invention. The flowchart and block diagrams in FIG. 3 illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As shown in FIG. 3, in accordance with aspects of the present invention described herein, in order to simplify F and Fbar functions to generate the true logic component and complementary logic component for each level shifter, a simplification process for stack optimization 100 may be implemented where F=function (N input vectors, not inclusive of its complementary values), such that there are $2^N$ states. At step 105, the simplification process for stack optimization 100 begins. At step 110, F and Fbar are solved and simplified individually using traditional techniques of function reduction, but not limited to, such as Karnaugh maps, De Morgan's laws etc. The simplification can be such that it results in a minimal number of series transistor stages in true logic component 20 between output 40 and ground D, and a minimal number of series transistor stages in complementary logic component 25 between output 45 and ground D. Since a certain function could be solved in many ways, the objective in accordance with aspects of the present invention is to use the most simplified version (with respect to series stages from output node to ground) as the starting point to the disclosed stack optimization procedure 100. However, even if the most simplified version is not used as starting point in alternative embodiments of the present invention, the stack optimization procedure 100 will work but it may take longer for the stack optimization as the process proceeds through the following flow described herein. At step 115, a determination is made as to whether F or Fbar has more than a predetermined number (e.g., three) of FET series stages for any combination of the input vectors. In embodiments, the predetermined number of FET series stages may depend on a maximum allowable series stages for a given technology and a given value of supply 35 for proper operation with voltage headroom. For example, if the maximum allowable series stages from supply 35 to ground D is six, and if a FIG. 2 type of embodiment with the PFET cross couples 15 and protection interface 50 is chosen, then the predetermined number of series stages for use within the true and complementary logic blocks 20, 25 would be six minus 1 FET (block 15) minus 2 FETs (block 50), equaling 3. When F has more than the predetermined number of FET series stages for any combination of the input vectors and Fbar does not, the process proceeds to Flow 1 beginning at step 120 where the stack is optimized starting from F, wherein Fi=2. When both F and Fbar have more than the predetermined number of FET series stages for any combination of the input vectors, the process proceeds to step 125 where a decision is made to either proceed with Flow 1 at step 120 or Flow 2 at step 130. In embodiments, this decision is either automated or made manually by a user. When Fbar has more than the predetermined number of FET series stages for any combination of the input vectors and F does not, the process proceeds to Flow 2 beginning at step 130 where the stack is optimized starting from Fbar, wherein Fbari=2. When neither F nor Fbar have more than the predetermined number of FET series stages for any combination of the input vectors, the process proceeds to step 199 where the stack optimization is completed.

With respect to Flow 1, at step 135, sub-functions F1 through Fi (each of them being subset(F)) are created each up to the predetermined number of series stages. In one embodiment, this may be performed such that F1=F for p1 states out of $2^N$ states, and F1=0 for the remaining ($2^N$-p1) states, F2=F for p2 states out of $2^N$ states, and F2=0 for the remaining ($2^N$-p2) states, and so on till Fi=F for pi states out of $2^N$ states, and Fi=0 for the remaining ($2^N$-pi) states such that all $2^N$ states are covered by the union of states covered by p1 through pi. The respective complement sub-functions F1bar through Fibar (each of them being subset(Fbar)) are created complementarily from F1 through Fi respectively. At step 140, all of the sub-functions (e.g., F1 and F1bar) created in step 135 are solved for the minimal number of series FET stages.

At step 145, a determination is made as to whether any of the sub-functions have more than the pre-determined number of FET stages. When at least one sub-function has more than the predetermined number of FET stages, the process continues at step 150. When at least one sub-function does not have more than the predetermined number of FET stages, the process continues at step 195. At step 150, a determination is made as to whether all possible sets of i combination functions for F have been explored. When all possible sets of i combination functions for F have been explored, the process proceeds to step 155. When all possible sets of i combination functions for F have not been explored, the process proceeds to step 160. At step 155, the number of level shifters is increased such that i=i+1. At step 160, an unexplored "i" set of sub functions that covers F may be recreated. The process then cycles back to step 135 after either step 155 or step 160 is performed.

With respect to Flow 2, at step 165, sub-functions F1bar through Fibar (each of them being subset(Fbar)) are created each up to the predetermined number of series stages. In embodiments, this may be performed such that F1bar=F for p1 states out of $2^N$ states, and F1bar=0 for the remaining ($2^N$-p1) states, F2 bar=Fbar for p2 states out of $2^N$ states, and F2 bar=0 for the remaining ($2^N$-p2) states, and so on till Fibar=Fbar for pi states out of $2^N$ states, and Fibar=0 for the remaining ($2^N$-pi) states such that all $2^N$ states are covered by the union of states covered by p1 through pi. The respective true sub-functions F1 through Fi (each of them being subset (F)) are created complementarily from F1bar through Fibar respectively. At step 170, all of the sub-functions (e.g., F1bar and F1) created in step 170 are solved for the minimal number of series FET stages.

At step 175, a determination is made as to whether any of the sub-functions have more than the pre-determined number of FET stages. When at least one sub-function has more than the predetermined number of FET stages, the process continues at step 180. When at least one sub-function does not have more than the predetermined number of FET stages, the process continues at step 195. At step 180, a determination is made as to whether all possible sets of i combination functions for Fbar have been explored. When all possible sets of i combination functions for Fbar have been explored, the process proceeds to step 185. When all possible sets of i combination functions for Fbar have not been explored, the process proceeds to step 190. At step 185, the number of level shifters is increased such that i=i+1. At step 190, an unexplored "i" set of sub functions that covers Fbar may be recreated. The process then cycles back to step 165 after either step 185 or step 190 is performed.

At step 195, the i number of level shifters may be constructed (e.g., {F1, F1bar} (first level shifter) . . . {Fi, Fibar} (ith level shifter)). At step 197, the level shifters (e.g., {F1, F1bar} . . . {Fi, Fibar}) may be linked together to generate F as an OR of all sub-functions (e.g., F1 and F2). Furthermore, at step 197, the level shifters (e.g., {F1, F1bar} ... {Fi, Fibar}) may be linked together to generate Fbar as an AND of all sub-functions (e.g., F1bar and F2 bar), if Flow 1 was performed. Alternatively, the processes of step 197 may be reversed such that the level shifters may be linked together to generate F as an AND of all sub-functions (e.g., F1 and F2), and the level shifters may be linked together to generate Fbar as an OR of all sub-functions (e.g., F1bar and F2 bar), if Flow 2 was performed. At step 199, the stack optimization is completed.

Table 1 below illustrates an embodiment of sub-functions based on the above described simplification process 100, where the F and Fbar functions are simplified to F1 and F1bar functions and F2 and F2 bar functions such that the OR of F1 and F2=F and the AND of F1bar and F2 bar=Fbar. Advantageously, the simplification of F and Fbar, as described herein, allows for two or more level shifters with embedded logic to be used for obtaining functions F and Fbar without exceeding a limit on a number of FETs stacked on either side of the level shifter for a given technology and given supply voltage.

TABLE 1

| A | B | C | D | E | F | Fbar | F1 | F1bar | F2 | F2bar |
|---|---|---|---|---|---|---|---|---|---|---|
| 0 | 0 | 0 | 0 | 0 | 1 | 0 | 1 | 0 | 0 | 1 |
| 0 | 0 | 0 | 0 | 1 | 1 | 0 | 1 | 0 | 1 | 0 |
| 0 | 0 | 0 | 1 | 0 | 1 | 0 | 1 | 0 | 0 | 1 |
| 0 | 0 | 0 | 1 | 1 | 1 | 0 | 1 | 0 | 1 | 0 |
| 0 | 0 | 1 | 0 | 0 | 1 | 0 | 1 | 0 | 0 | 1 |
| 0 | 0 | 1 | 0 | 1 | 1 | 0 | 1 | 0 | 1 | 0 |
| 0 | 0 | 1 | 1 | 0 | 1 | 0 | 1 | 0 | 0 | 1 |
| 0 | 0 | 1 | 1 | 1 | 1 | 0 | 1 | 0 | 1 | 0 |
| 0 | 1 | 0 | 0 | 0 | 1 | 0 | 1 | 0 | 0 | 1 |
| 0 | 1 | 0 | 0 | 1 | 1 | 0 | 0 | 1 | 1 | 0 |
| 0 | 1 | 0 | 1 | 0 | 1 | 0 | 1 | 0 | 0 | 1 |
| 0 | 1 | 0 | 1 | 1 | 0 | 0 | 0 | 1 | 1 | 0 |
| 0 | 1 | 1 | 0 | 0 | 1 | 0 | 1 | 0 | 0 | 1 |
| 0 | 1 | 1 | 0 | 1 | 0 | 1 | 0 | 1 | 0 | 1 |
| 0 | 1 | 1 | 1 | 0 | 1 | 0 | 1 | 0 | 0 | 1 |
| 0 | 1 | 1 | 1 | 1 | 1 | 0 | 1 | 1 | 1 | 0 |
| 1 | 0 | 0 | 0 | 0 | 1 | 0 | 1 | 0 | 0 | 1 |
| 1 | 0 | 0 | 0 | 1 | 0 | 1 | 0 | 1 | 0 | 1 |
| 1 | 0 | 0 | 1 | 0 | 1 | 0 | 1 | 0 | 0 | 1 |
| 1 | 0 | 0 | 1 | 1 | 0 | 1 | 0 | 1 | 0 | 1 |
| 1 | 0 | 1 | 0 | 0 | 1 | 0 | 1 | 0 | 0 | 1 |
| 1 | 0 | 1 | 0 | 1 | 0 | 1 | 0 | 1 | 0 | 1 |
| 1 | 0 | 1 | 1 | 0 | 1 | 0 | 1 | 0 | 0 | 1 |
| 1 | 0 | 1 | 1 | 1 | 0 | 1 | 0 | 1 | 0 | 1 |
| 1 | 1 | 0 | 0 | 0 | 1 | 0 | 1 | 0 | 0 | 1 |
| 1 | 1 | 0 | 0 | 1 | 0 | 1 | 0 | 1 | 0 | 1 |
| 1 | 1 | 0 | 1 | 0 | 1 | 0 | 1 | 0 | 0 | 1 |
| 1 | 1 | 0 | 1 | 1 | 0 | 1 | 0 | 1 | 0 | 1 |
| 1 | 1 | 1 | 0 | 0 | 1 | 0 | 1 | 0 | 0 | 1 |
| 1 | 1 | 1 | 0 | 1 | 0 | 1 | 0 | 1 | 0 | 1 |
| 1 | 1 | 1 | 1 | 0 | 1 | 0 | 1 | 0 | 0 | 1 |
| 1 | 1 | 1 | 1 | 1 | 0 | 1 | 0 | 1 | 0 | 1 |

F1 = Ebar + (Abar.Bbar)
F1bar = E (A + B)
F2 = Abar. E. (D + Bar + Cbar)
F2bar = A + Ebar + (Dbar.B.C)

Figure 4:
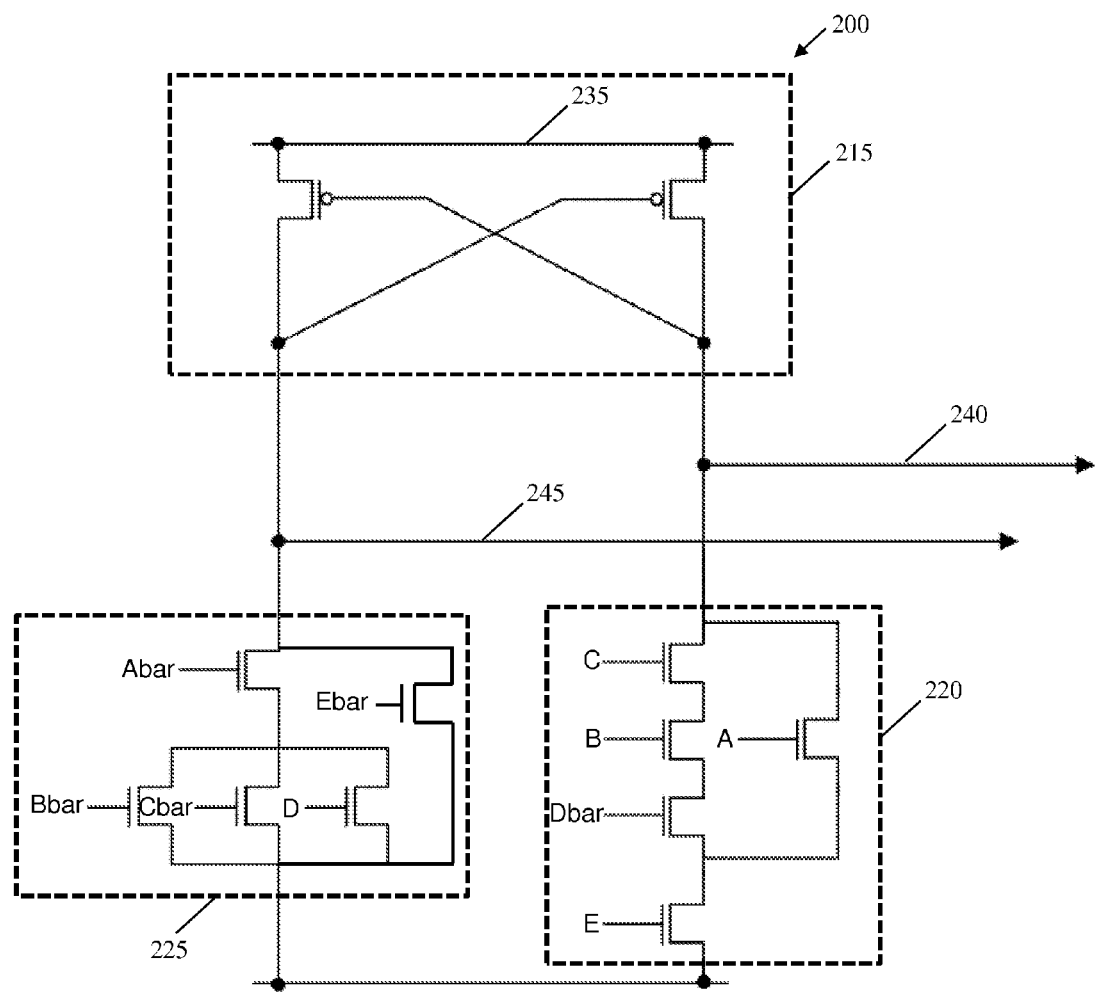
FIGS. 4 and 5 are schematic diagrams of level shifter circuits with embedded logic in accordance with aspects of the invention.
Figure 5:
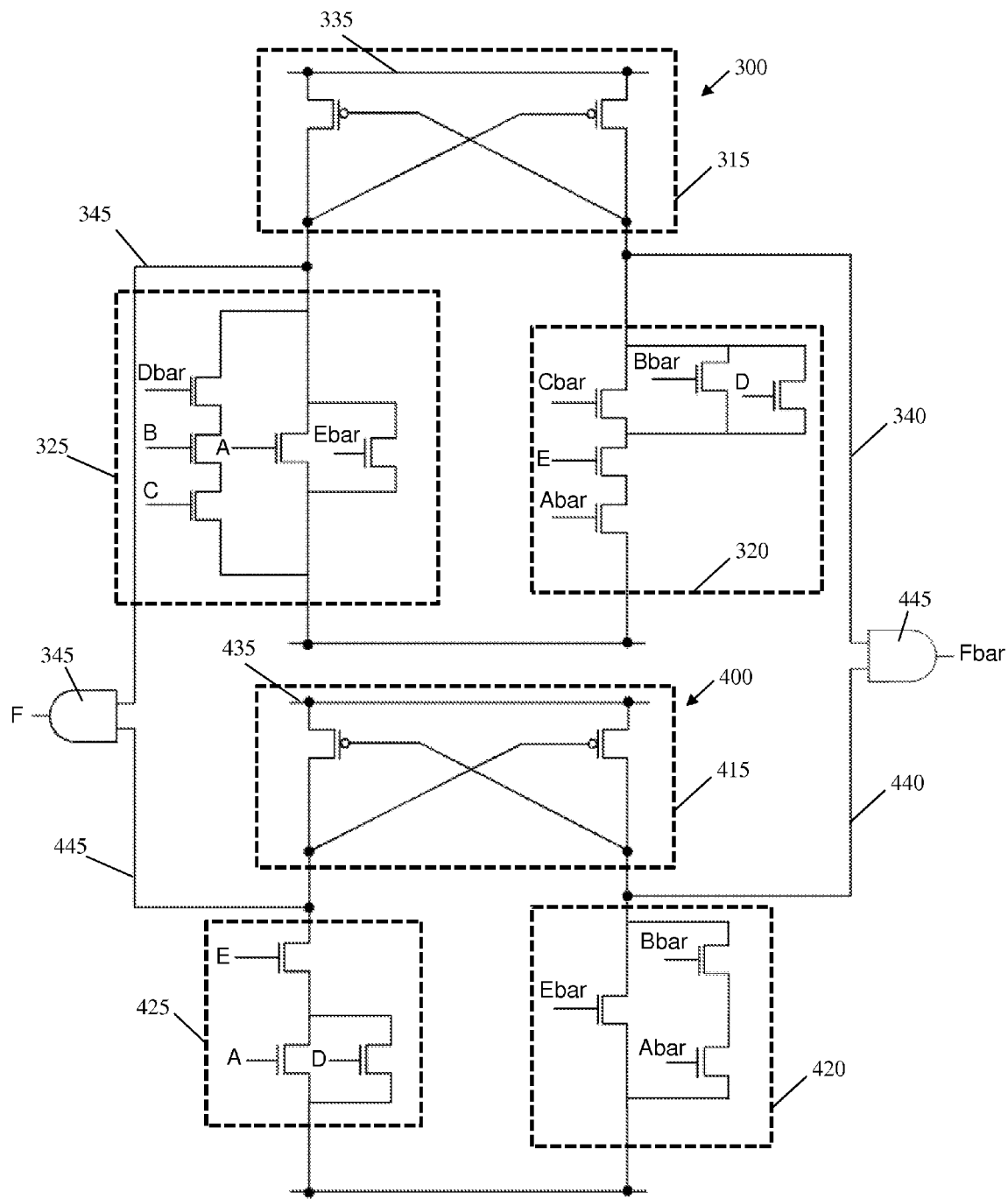

The simplification process 100 of FIG. 3 is illustrated by the exemplary circuit diagrams shown in FIGS. 4 and 5. For example, FIG. 4 shows a circuit diagram in which the level shifter 200 may comprise a cross coupled FET 215, the embedded logic component comprising the true logic component 220 and the complementary logic component 225, vectors or signals A, B, C, D, E, Abar, Bbar, Cbar, Dbar, and Ebar from a first supply voltage domain, the second supply voltage domain 235 (e.g., Vddr), the output function 240 ("Fbar"), and the complementary output function 245 ("F"). As should be understood by those of ordinary skill in the art, the output function 245 ("F")=(E.(A+C.B.Dbar)=>four nFETs in series if {ABODE}={1101}; and the complementary output function 240 ("Fbar")=Ebar+[Abar.(Cbar+Bbar+D)]=>two nFETs in series if {ABODE}={0x0xx}, {00xxx}, {0xx1x}; and =Ebar+(Abar.Cbar)+(Abar.Bbar)+(Abar.D). Consequently, the output function 245 ("F") exceeds, for example, three FETs in series, and therefore, should be designed based on at least two sub-functions (e.g., F1 and F2) in accordance with aspects of the simplification process 100 to avoid any stacking issues.

For example, FIG. 5 shows an embodiment of two parallel level shifters each implementing functions F1 and F2 respectively, and F1bar and F2 bar, respectively. Specifically, a first level shifter 300 may comprise a cross coupled FET 315, an embedded logic component comprising a true logic component 320 and a complementary logic component 325, vectors or signals A, B, C, D, E, Abar, Bbar, Cbar, Dbar, and Ebar from a first supply voltage domain, a second supply voltage domain 335 (e.g., $V_{dd}$), an output function 340 ("F1bar"), and a complementary output function 345 ("F1").

A second level shifter 400 may comprise a cross coupled FET 415, an embedded logic component comprising a true logic component 420 and a complementary logic component 425, vectors or signals A, D, E, Abar, Bbar, and Ebar from the first supply voltage domain, the second supply voltage domain 435 (e.g., $V_{dd}$), an output function 340 ("F2bar"), and a complementary output function 345 ("F2"). The first level shifter 300 and the second level shifter 400 may be linked together with one or more logic gates 345 to generate F as an OR/AND of the sub-functions (e.g., F1 and F2), and linked together with one or more logic gates 445 to generate Fbar as an AND/OR of all the sub-functions (e.g., F1bar and F2 bar). Advantageously, this embodiment addresses voltage head room issues that a lone level shifter implementation (e.g., FIG. 4) with four series nFETs would have for technologies below 45 nm with the second supply voltage domain 335, 435 smaller than 1.0V. As should be understood by those of ordinary skill in the art, the protection circuit, as discussed with respect to FIG. 2, may also be implemented in one or more of the level shifters of the present embodiment in order to even more advantageously provide such structures with increased $V_{max}$ reliability.

Figure 6:
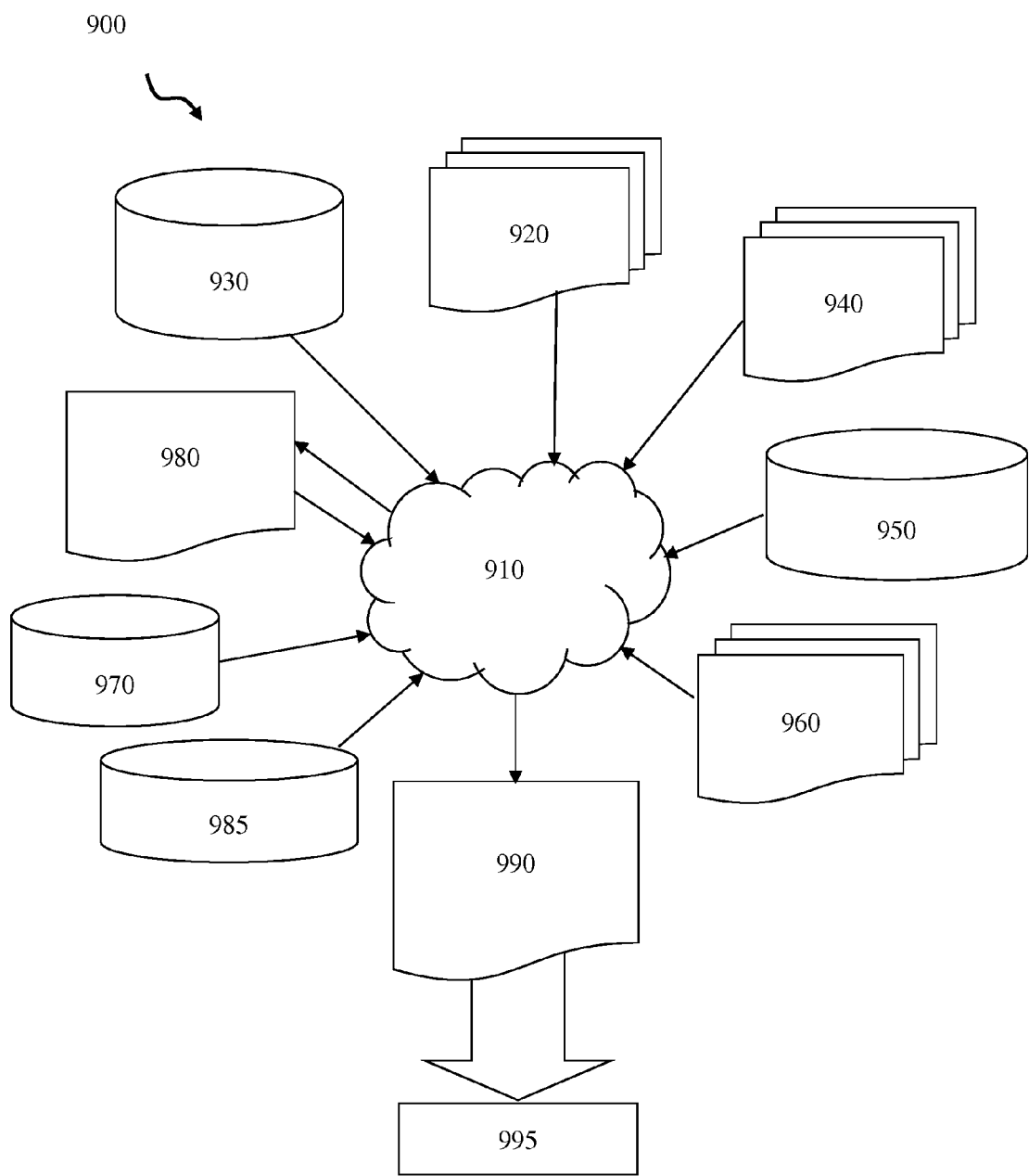
FIG. 6 is a flow diagram of a design process used in semiconductor design, manufacture, and/or test.

FIG. 6 is a flow diagram of a design process used in semiconductor design, manufacture, and/or test. FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 2, 4, and 5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures in any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2, 4, and 5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2, 4, and 5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2, 4, and 5. In one embodiment, design structure 990 may comprise a compiled, executable HDL simulation model that functionally simulates the devices shown in FIGS. 1, 2, 4, and 5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2, 4, and 5. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit comprising:
   at least one set of inputs from a first power supply domain;
   at least two cross coupled field effect transistors (FETs) connected to a second power supply domain, wherein the at least two cross coupled FETs are pFETs;
   a true logic gate connected to the first power supply domain and the at least two cross coupled FETs, wherein the true logic gate is comprised of at least one nFET and configured to generate a logic function based on the at least one set of inputs; and
   a complementary logic gate connected to the first power supply domain and the at least two cross coupled FETs, wherein the complementary logic gate is comprised of at least one nFET and configured to generate a complement of the logic function based on the at least one set of inputs,
   wherein the pFETs and nFETs are thin-oxide FETs.

2. The circuit of claim 1, wherein:
   a source of one of the at least two cross coupled FETs is connected to the second power supply domain;
   a source of another of the at least two cross coupled FETs is connected to the second power supply domain;
   a drain of the one of the at least two cross coupled FETs is connected to a drain of the true logic gate; and
   a drain of the another of the at least two cross coupled FETs is connected to a drain of the complementary logic gate.

3. The circuit of claim 2, wherein the first power supply domain and the second power supply domain provide different voltage levels.

4. The circuit of claim 3, wherein:
   a source of the true logic gate is connected to ground; and
   a source of the complementary logic gate is connected to ground.

5. The circuit of claim 1, further comprising a protection circuit positioned between the at least two cross coupled FETs and the true and complementary logic gates.

6. The circuit of claim 5, wherein the protection circuit comprises at least four thin-oxide FETs.

7. A structure, comprising:
   at least one set of inputs from a first power supply domain;
   at least two cross coupled field effect transistors (FETs) connected to a second power supply domain;
   a true logic gate connected to the first power supply domain and the at least two cross coupled FETs, wherein the true logic gate is configured to generate a logic function based on the at least one set of inputs;
   a complementary logic gate connected to the first power supply domain and the at least two cross coupled FETs, wherein the complementary logic gate is configured to generate a complement of the logic function based on the at least one set of inputs; and
   a protection interface positioned between the at least two cross coupled FETs and the true and complementary logic gates, wherein the protection interface is controlled by high and low protection analog voltages.

8. The structure of claim 7, wherein the first power supply domain and the second power supply domain provide different voltage levels.

9. The structure of claim 8, wherein:
   the at least two cross coupled FETs are pFETs;
   the true logic gate is comprised of at least one nFET;
   the complementary logic gate is comprised of at least one nFET; and
   the protection circuit comprises at least two pFETs and at least two nFETs.

10. The structure of claim 9, wherein all of the pFETs and nFETs are thin-oxide FETs.

11. The structure of claim 10, wherein:
    a source of one of the at least two cross coupled pFETs is connected to the second power supply domain;
    a source of another of the at least two cross coupled pFETs is connected to the second power supply domain;
    a drain of the one of the at least two cross coupled pFETs is connected to a source of one of the two pFETs of the protection circuit; and
    a drain of the another of the at least two cross coupled pFETs is connected to a source of another of the two pFETs of the protection circuit.

12. The structure of claim 11, wherein:
    a drain of the one of the two pFETs of the protection circuit is connected to a source of one of the two nFETs of the protection circuit; and
    a drain of the another of the two pFETs of the protection circuit is connected to a source of another of the two nFETs of the protection circuit.

13. The structure of claim 12, wherein:
    a drain of the one of the two nFETs of the protection circuit is connected to a drain of the at least one nFET of the true logic gate; and
    a drain of the another of the two nFETs of the protection circuit is connected to a drain of the at least one nFET of the complementary logic gate.

14. A structure comprising at least two level shifters configured to receive a set of input vectors in a first voltage domain to create a true and complement output function in a second voltage domain, wherein:
    each of the at least two level shifters is powered by the second voltage domain;
    each of the at least two level shifters is configured to generate a true and complement sub-function output in the second voltage domain
    each of the at least two level shifters comprising a stacking of a number of transistors less than a predetermined number; and
    the at least two level shifters are configured to operate in parallel such that each true and complement sub-function output is coupled with one or more AND or OR gates to create the true and complement output function respectively for all combinations of the set of input vectors.

15. The structure of claim 14, wherein the predetermined number is based on providing sufficient voltage headroom for the at least two level shifters to operate in a predetermined technology and the second voltage domain.

16. The structure of claim 15, wherein each of the at least two level shifters comprises a true logic component configured to generate the true sub-function output, and a complementary logic component configured to generate the complementary sub-function output.

17. The structure of claim 16, wherein each of the at least two level shifters further comprises a protection circuit positioned between at least two cross coupled field effect transistors (FETs) and the true and complementary logic components.

* * * * *